United States Patent
Huang et al.

(10) Patent No.: US 6,458,626 B1
(45) Date of Patent: Oct. 1, 2002

(54) FABRICATING METHOD FOR SEMICONDUCTOR PACKAGE

(75) Inventors: Chien-Ping Huang, Hsinchu Hsien; Tzong-Da Ho, Taichung; Cheng-Hsu Hsiao, Nantou, all of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/921,775

(22) Filed: Aug. 3, 2001

(51) Int. Cl.[7] .............................................. H01L 21/44
(52) U.S. Cl. ...................... 438/112; 438/106; 438/122; 438/113
(58) Field of Search ................................ 438/106–127, 438/460, 464

(56) References Cited

U.S. PATENT DOCUMENTS

| | | | | |
|---|---|---|---|---|
| 5,041,902 A | * | 8/1991 | McShane | 357/79 |
| 5,222,014 A | * | 6/1993 | Lin | 361/414 |
| 5,234,867 A | * | 8/1993 | Schultz et al. | 437/225 |
| 5,327,104 A | * | 7/1994 | Kikushima | 331/68 |
| 5,471,366 A | * | 11/1995 | Ozawa | 361/704 |
| 5,705,851 A | * | 1/1998 | Mostafazadeh et al. | 257/675 |
| 5,726,079 A | | 3/1998 | Johnson | 438/106 |
| 6,057,381 A | * | 5/2000 | Ma et al. | 522/99 |
| 6,117,797 A | * | 9/2000 | Hembree | 438/759 |
| 6,236,568 B1 | * | 5/2001 | Lai et al. | 361/704 |
| 6,249,434 B1 | * | 6/2001 | Scafidi | 361/704 |
| 6,251,707 B1 | * | 6/2001 | Bernier et al. | 438/122 |
| 6,326,678 B1 | * | 12/2001 | Karnezos et al. | 257/666 |
| 6,358,776 B1 | * | 3/2002 | Takehara et al. | 438/113 |

* cited by examiner

Primary Examiner—Michael Sherry
Assistant Examiner—Scott B. Geyer
(74) Attorney, Agent, or Firm—Peter F. Corless; Steven M. Jensen; Edwards & Angell, LLP

(57) ABSTRACT

A fabricating method for a semiconductor package is proposed, in which a substrate module plate consisting of a plurality of array-arranged substrates is mounted with at least one chip on each of the substrates, so as to allow a heat sink module plate coated with an interface layer to attach to the chips. Subsequently, an encapsulant is formed by a molding compound for encapsulating the chip carrier module plate, the chips and the heat sink module plate during molding. As the adhesion between the interface layer and the encapsulant is smaller than that between the heat sink module plate and the encapsulant, the portion of the encapsulant formed on the interface layer can be easily removed without causing damage to the fabricated semiconductor package and delamination of the heat sink module plant from the encapsulant.

22 Claims, 7 Drawing Sheets

FABRICATING METHOD FOR SEMICONDUCTOR PACKAGE

FIELD OF THE INVENTION

This invention relates to fabricating methods for semiconductor packages, and more particularly, to a fabricating method for a semiconductor package with a heat sink so as to improve the heat-dissipating efficiency.

BACKGROUND OF THE INVENTION

A conventional semiconductor package having a semiconductor chip encapsulated by an encapsulant is concerned with efficient dissipation of heat generated by the chip during operation, so as to assure the lifetime and quality of the semiconductor package.

However, as the encapsulant for enclosing the semiconductor chip is made of a molding compound e.g. epoxy resin that is poor in thermal conductivity, the heat generated by the chip is unable to be effectively dissipated through the encapsulant. Accordingly, a metallic heat sink or heat block is incorporated in the semiconductor package for improving the heat-dissipating efficiency. However, it is undesirable if the heat sink is entirely encapsulated by the encapsulant, in which the generated heat still needs to pass through the encapsulant for dissipation, limiting the improvement in the heat-dissipating efficiency. Therefore, it is preferable to construct a semiconductor package having a surface of the heat sink exposed to the atmosphere, allowing the generated heat to be directly dissipated through the exposed surface. Nevertheless, if the heat sink is not in direct contact with the chip, while the molding compound is filled in a space between the heat sink and the chip, the heat dissipation will be undesirably impeded due to the heat generated by the chip unable to be effectively transmitted to the heat sink.

Thus, U.S. Pat. Nos. 5,726,079 and 5,471,366 respectively disclose a semiconductor package illustrated in FIG. 8. The semiconductor package 1 has a heat sink 11 directly attached to a chip 10, while a top surface 110 of the heat sink 11 is exposed to the outside of an encapsulant 12 used for encapsulating the chip 10. With the direct contact between the chip 10 and the heat sink 11, and between the exposed top surface 110 of the heat sink 11 and the atmosphere, heat generated by the chip 10 can be directly transmitted to the heat sink 11 for dissipation without passing through the encapsulant 12. This makes the semiconductor package 1 have better heat-dissipating efficiency than the one as previously recited.

Nevertheless, some drawbacks have been found for the semiconductor package 1 in fabrication. First, while the chip 10 together with the heat sink 11 are placed in a mold cavity in a molding process, the top surface 110 of the heat sink 11 should closely abut a top wall of the mold cavity for preventing a molding resin from flashing on the top surface 110 of the heat sink 11. Alternatively, if there is a gap formed between the top surface 110 of heat sink 11 and the top wall of the mold cavity, resin flash occurs on the top surface 110 of the heat sink 11, making a fabricated product deteriorated in profile and in heat-dissipating efficiency, and subsequently a deflash process is definitely required. However, the flash process is undesirably time-consuming and cost-ineffective, even possibly causing damage to the fabricated product. On the other hand, if the heat sink 11 abuts the top wall of the mold cavity too closely, excessive clamping force from the mold cavity will crack the fragile chip 10 beneath the heat sink 11.

Furthermore, an adhesive or laminating tape used in the attachment of the heat sink 11 to the chip 10 is usually made of a thermosetting material, which remains soft before being heated for curing. This makes the structure of the chip 10 combined with the heat sink 11 not precisely controlled in height, thus inducing the foregoing problem of the top surface 110 of the heat sink 11 not appropriately abutting the top wall of the mold cavity. As a result, the fabricated product can not be assured in quality as well as not cost-effective in fabrication.

Furthermore, due to lack of preciseness in the height controlling as mentioned above, the attachment of the heat sink 11 to the chip 10 can not be accomplished in a batch-type manner in the molding process for the semiconductor package 1. That is, the heat sink 11 must be attached to its corresponding chip 10 one by one. This obviously increases the complexity and time consumption for the molding process.

In addition, the heat-dissipating efficiency of the semiconductor package 1 is proportional to the exposed surface area of the heat sink 11. That is, with the semiconductor package 1 remained constant m dimension, the heat sink 11 can be made to maximize the exposed surface area for providing optimal heat-dissipating efficiency. However, in the case of the heat sink is dimensioned to be identical in surface area to the semiconductor package, if the heat sink is not precisely made, the heat sink can not be placed into the mold cavity properly when the heat sink is over-sized; while resin flash tends to occur on the top surface and side surfaces of the heat sink when the heat sink is insufficiently dimensioned.

SUMMARY OF THE INVENTION

A primary objective of the present invention is to provide a fabricating method for a semiconductor package, in which a heat sink is incorporated in the semiconductor package and dimensioned to maximize an exposed surface area thereof, so as to prevent resin flash from occurrence and improve the heat-dissipating efficiency. Moreover, the semiconductor package fabricated by the fabricating method of the invention allows the heat sink to come in direct contact with a chip for further improving the heat-dissipating efficiency, and also prevents the chip from cracking in a molding process for assuring quality of the package. Furthermore, the invention can be implemented with the heat sink being attached to the chip in a batch-type manner in no concern with height controlling, which makes the overall fabrication simplified in process and reduced in cost. In addition, molds used in the fabricating method of the invention can also be applied to various sized products, further reducing the fabrication cost.

In accordance with the above and other objectives, a fabricating method for a semiconductor package is proposed in the present invention, comprising the steps of: providing a matrix type chip carrier module plate consisting of a plurality of array-arranged chip carriers, wherein the chip carriers each has an upper surface and a lower surface; mounting at least one chip at a predetermined position on the upper surface of each of the chip carriers, and electrically connecting the chip to the chip carrier; providing a heat sink module plate having an upper surface and a lower surface, and attaching the lower surface of the heat sink module plate to the chips for interposing the chips between the chip carrier module plate and the heat sink module plate, wherein an interface layer is formed on the upper surface of the heat sink module plate, allowing adhesion between the interface layer and a molding compound to be smaller than that between the heat sink module plate and the molding compound; forming an encapsulant by the molding compound for encapsulating the heat sink module plate, the chips and the chip carrier module plate; performing a singulation process for forming individual semifabricated semiconductor packages corresponding in number to the plurality of chip carriers; and removing the molding compound formed on the interface layer so as to complete the fabrication of the semiconductor package.

The combined structure of the heat sink module plate, the chip and the chip carrier module plate has a height smaller than that of a mold cavity of a mold used in a molding process, in order to allow the molding compound to encapsulate the interface layer on the heat sink module plate upon completion of the molding process. As the interface layer has poor adhesion to the molding compound, the molding compound on the interface layer can be easily removed after the singulation process, which will not lead to delamination between a heat sink (formed by singulating the heat sink module plate) and the encapsulant due to good adhesion therebetween. Furthermore, as the heat sink module plate does not abut a top wall of the mold cavity, there is no concern for the chip to be cracked by the pressure from the mold via the heat sink module plate during molding. In addition, due to certain extent in flexibility for the height of the above combined structure, the mold can be applied to various kinds of semiconductor packages varied in height.

The interface layer on the heat sink can be made of a metallic material having poor adhesion to the molding compound for forming the encapsulant, such as gold, chromium, nickel, alloy thereof, or Teflon, making the heat dissipation through the heat sink not undesirably affected by the interface layer.

In a preferred embodiment of the invention, the chip carrier is a BGA (ball grid array) substrate, in which at least one hole is formed on the substrate, allowing bonding wires to pass through the hole for electrically connecting the substrate to the chip. On a surface of the substrate opposing that for mounting the chip thereon there are implanted a plurality of solder balls, which are used to electrically connect the chip to an external device.

In another preferred embodiment of the invention, the chip carrier is a flip chip substrate, that is, on an upper surface of the substrate there are formed a plurality of array-arranged solder pads for bonding a plurality of solder bumps thereto, while the solder bumps are used to electrically connect the chip to the substrate. Moreover, on a lower surface of the substrate there are implanted a plurality of solder balls for electrically connecting the chip to an external device.

In a further preferred embodiment of the invention, the chip carrier is a QFN (quad flat nonlead) lead frame or a BGA substrate, which has an upper surface for mounting the chip thereon and is connected to the chip through a plurality of bonding wires. In order to prevent the bonding wires from being damaged by the attachment of the heat sink to the chip, on the first surface of the heat sink there is formed a connecting portion extending toward the chip at a position corresponding to the chip. This allows the heat sink to be connected to the chip through the connecting portion without contacting the bonding wires.

In a further preferred embodiment of the invention, the chip carrier is a QFN lead frame or a BGA substrate, which has an upper surface for mounting the chip thereon and is connected to the chip through a plurality of bonding wires. In order to prevent the bonding wires from being damaged by the attachment of the heat sink to the chip, as well as reduce a thermal stress generated from the heat sink to the chip due to the difference in CTE (coefficient of thermal expansion) between the heat sink and the chip, a buffer pad having a similar CTE to that of the chip can be interposed between the heat sink and the chip. The buffer pad is preferable a defective die for optimizing the reduction in the thermal stress.

In addition, the first surface of the heat sink can be roughened, corrugated or made uneven so as to enhance the bonding strength between the heat sink and the encapsulant.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF THE PREFERRED EMBODIMENT

First Preferred Embodiment

FIGS. 1(A)–1(H) illustrate the steps involved in the fabricating method for a semiconductor package 2 in a first embodiment of the invention; FIG. 2 illustrates the semiconductor package 2 fabricated by the first embodiment of the invention.

Figure 1A:
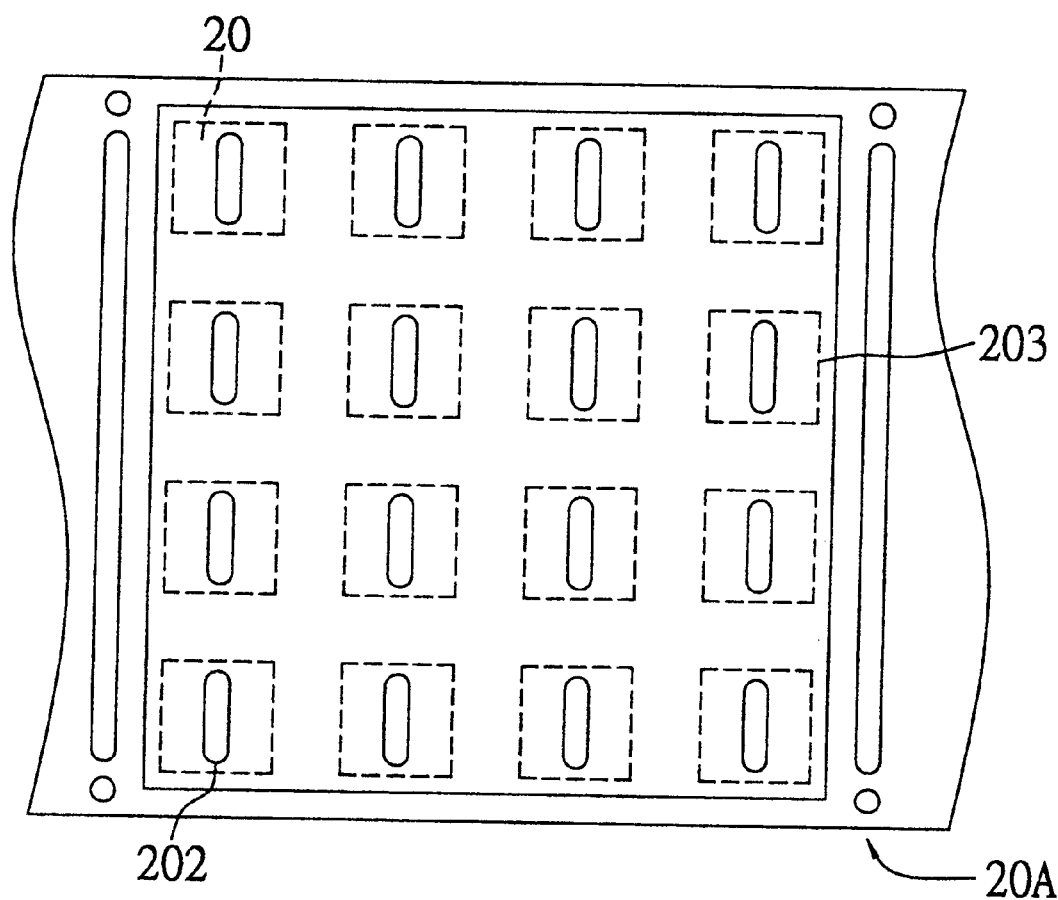
FIGS. 1(A)–1(H) are schematic diagrams showing the steps involved in the fabricating method for a semiconductor package in a first preferred embodiment of the invention.
Figure 2:
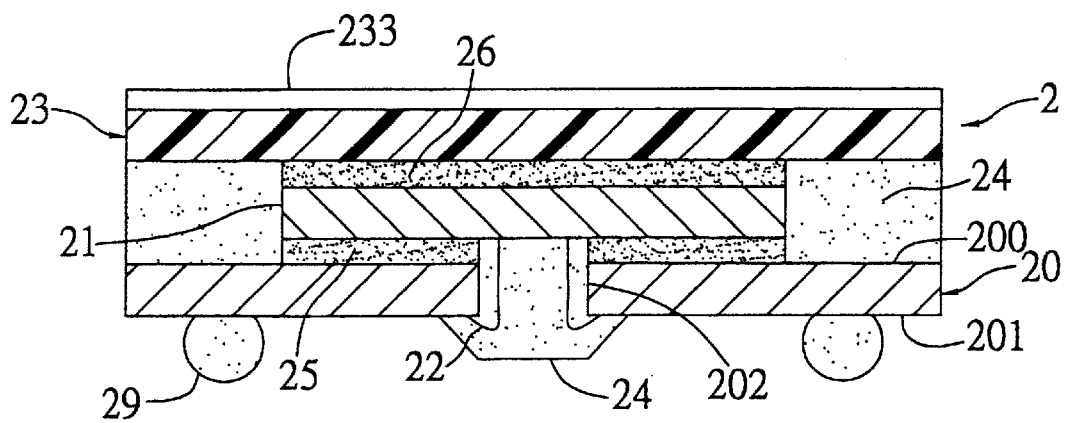
FIG. 2 is a sectional view of a semiconductor package fabricated by a first preferred embodiment of the invention.

Referring first to FIG. 1(A), a matrix type substrate module plate 20A is prepared, which consists of 16 substrates 20 arranged in 4×4 array, and the substrates 20 each has an upper surface 200, a lower surface 201, and a hole 202 penetrating the substrate 20.

Figure 1B:
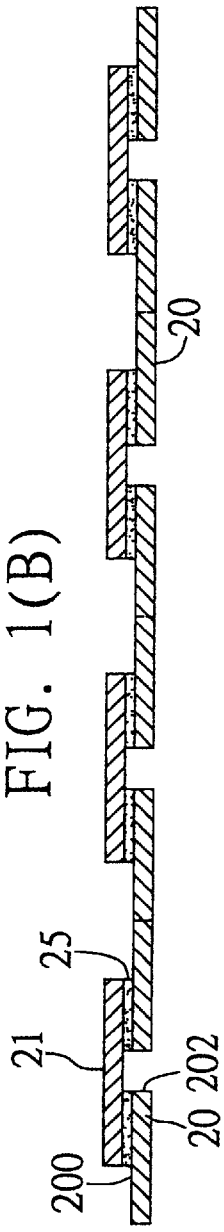

Referring next to FIG. 1(B), to a predetermined position on the upper surface 200 of each of the substrates 20 there is attached a chip 21 by an adhesive 25 such as silver paste in a manner that the chip 21 covers one end of the hole 202.

Figure 1C:
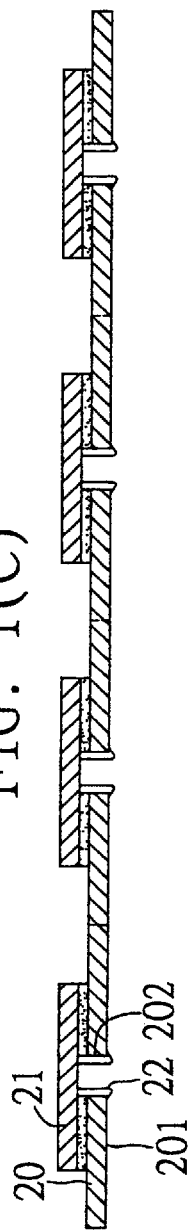

Referring further to FIG. 1(C), a plurality of gold wires 22 passing through the hole 202 are bonded to the chip 21 and the lower surface 201 of the substrate 20 for electrically connecting the chip 21 to the substrate 20. As the wire bonding employs a conventional process, it will not be further described herein.

Figure 1D:
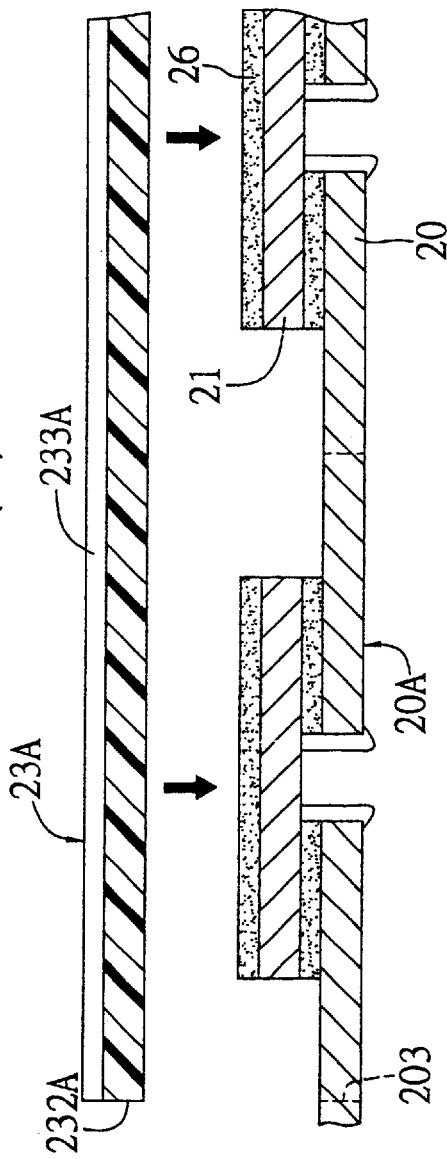

Referring further to FIG. 1(D), after the chip 21 is electrically connected to the substrate 20, a heat sink module plate 23A is attached to the chips 21 respectively by a conventional adhesive 26 (or a tape), while the heat sink module plate 23A is made of a metallic material such as copper, aluminum, copper alloy or aluminum alloy. The heat sink module plate 23A is sufficiently dimensioned for covering the substrates 20 having the chips 21 mounted thereon. That is, an area defined by side edges 232A of the module plate 23A is sufficient to encompass all side edges 203 (shown as dotted lines in FIG. 1(A)) of the substrates 20. Further, a top surface of the heat sink module plate 23A is coated with a gold layer 233A. The combined structure of the heat sink module plate 23A, the chips 21 and the substrate module plate 20A is so dimensioned that the gold layer 233A is spaced with a desired distance apart from a top wall of a mold cavity of a mold (not shown), when the combined structure is placed in the mold cavity. Besides gold, the coated layer on the heat sink module plate 23A can be formed of chromium, nickel, alloy thereof and Teflon, as long as adhesion between the coated layer and a molding compound used for encapsulating the chips 21 is smaller than that between a bottom surface of the module plate 23A and the molding compound.

Figure 1E:
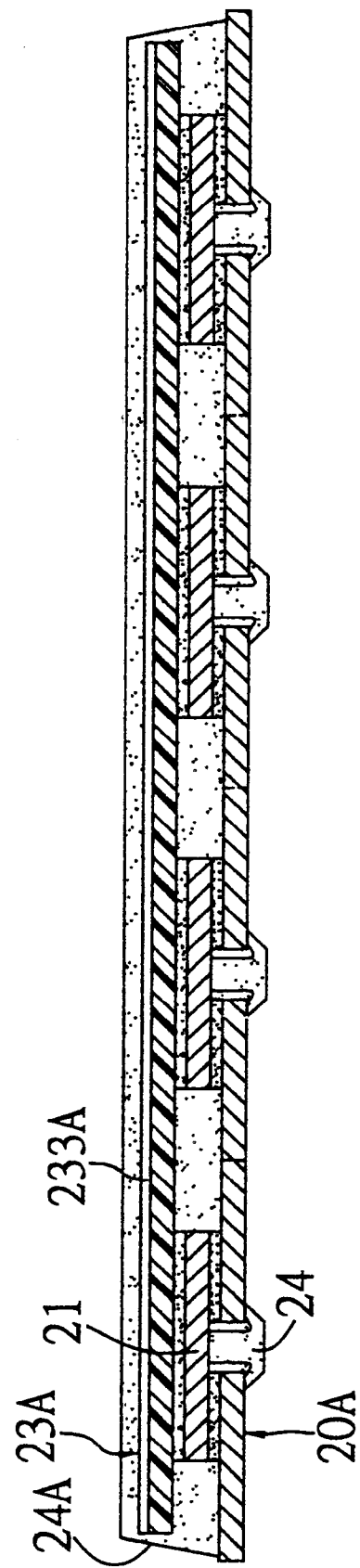

Referring further to FIG. 1(E), the combined structure of the heat sink module plate 23A, the chips 21 and the substrate module plate 20A is placed in the mold cavity of the mold for performing a molding process, which is used to form an encapsulant 24 by the molding compound for encapsulating the heat sink module plate 23A, the chips 21, the gold wires 22 and the substrate module plate 20A. As the combined structure is dimensioned for the gold layer 233A on the heat sink module plate 23A to be properly spaced from the top wall of the mold cavity, no cracks caused by the pressure from the mold via the heat sink module plate 23A will be generated for the chips 21. Further, as there is no concern for precisely controlling the height of the attachment of the heat sink module plate 23A to the chips 21, quality and reliability of the fabricated product can be assured, and the fabrication cost can be reduced as well.

Figure 1F:
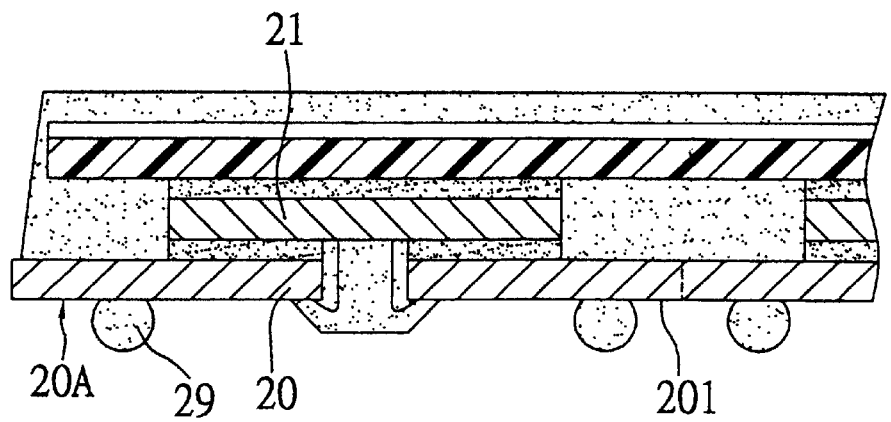

Referring to FIG. 1(F), after completing the molding process, on the lower surface 201 of each of the substrates 20 of the substrate module plate 20A there are implanted a plurality of solder balls 29 for electrically connecting the chips 21 to external devices. As the solder ball implantation employs a conventional process, it will not be further described herein.

Figure 1G:
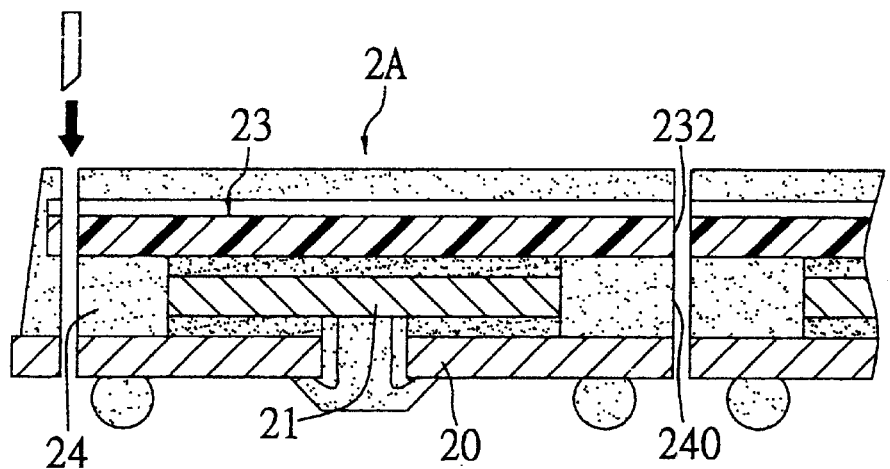

Referring to FIG. 1(G), a singulation process is performed by using a cutting machine for forming 16 semi-fabricated semiconductor packages 2A. The semi-fabricated package 2A has the side surfaces 232 of a heat sink 23 (formed by singulating the heat sink module plate 23A) exposed to the outside of the encapsulant 24 and aligned with side surfaces 240 of the encapsulant 24. This makes no resin flash occur on the side surfaces 232 of the heat sink 23; while the heat sink 23 has the same surface area as the substrate 20, the heat sink 23 can be maximized in surface area so as to effectively improve the heat-dissipating efficiency. Furthermore, since the attachment of the heat sink 23 to the chip 21 is accomplished in a batch type manner, the fabrication method can be simplified and more cost-effective as well as the fabrication time can be reduced.

Figure 1H:
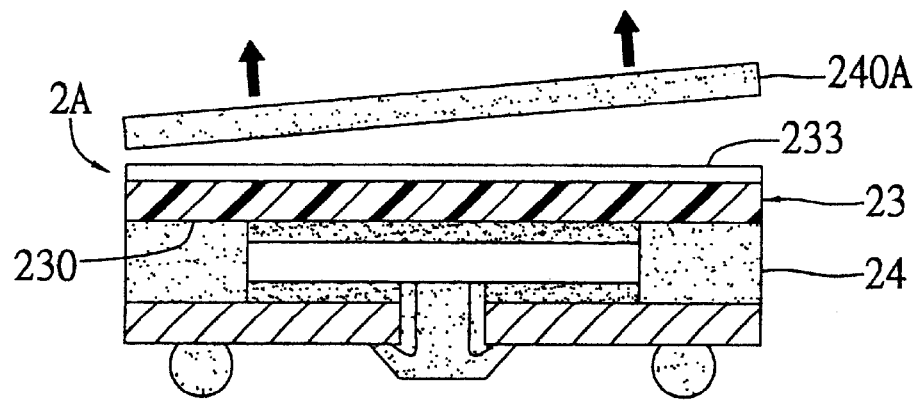

Referring finally to FIG. 1(H), the singulated semi-fabricated package 2A is heated for remained molding compound 240A on the gold layer 233 to be delaminated from the gold layer 233, due to difference in thermal expansion coefficient between the molding compound used for forming the encapsulant 24 and the gold layer 233, and adhesion between the gold layer 233 and the molding compound being smaller than that between the heat sink module plate 23A and the molding compound. It is required for the heating to be controlled to the extent that no delamination occurs between the beat sink 23, with first surface 230, and the encapsulant 24. This allows the remained molding compound 240A to be easily removed from the gold layer 233 without damaging the bonding of the heat sink 23 to the encapsulant 24. Further, since the remained molding compound 240A can be completely removed from the gold layer 233, a subsequent deflash process is not necessary, which not only reduces the fabrication cost but also assures quality of the fabricated semiconductor package 2, as shown in FIG. 2.

Second Preferred Embodiment

Figure 3:
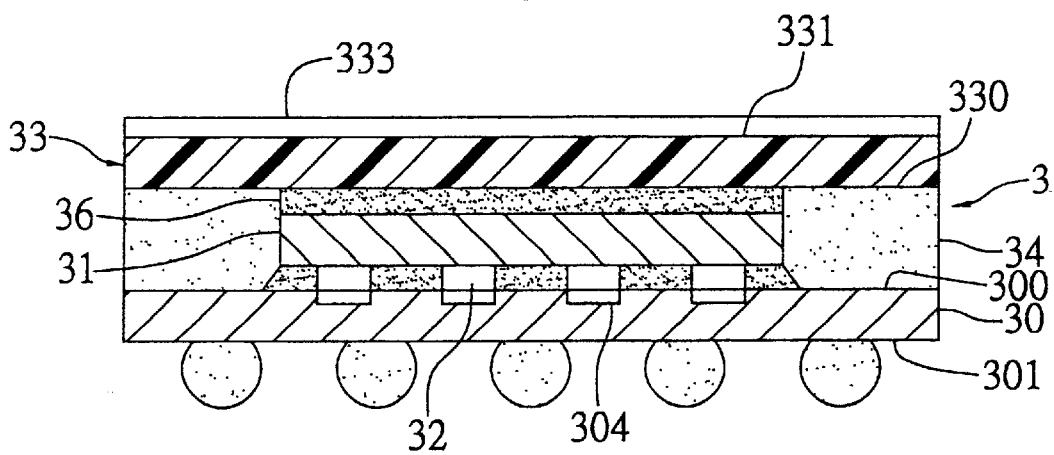
FIG. 3 is a sectional view of a semiconductor package fabricated by a second preferred embodiment of the invention.

FIG. 3 illustrates a semiconductor package 3 fabricated by a second embodiment of the invention. The semiconductor package 3 is fabricated by a method similar to that used for the semiconductor package 2 in the first embodiment, with differences in the die bonding and wire bonding processes due to a flip chip substrate 30 being provided in the semiconductor package 3. A plurality of bump pads 304 are formed at predetermined positions on an upper surface 300 of the substrate 30, and a plurality of conductive traces (not shown) are formed on the upper surface 300 and an opposing lower surface 301 of the substrate 30 respectively. Then, a plurality of solder bumps 32 are bonded to the bump pads 304 for electrically connecting a chip 31 to the substrate 30 in a flip chip manner via the solder bumps 32. The chip 31 is attached to a first surface 330 of a heat sink 33 by an adhesive 36, allowing heat generated by the chip 31 to be directly transmitted to the heat sink 33. Further, on a second surface 331 opposing the first surface 330 of the heat sink 33 there is coated a gold layer 333, so as for the adhesion between the gold layer 333 and a molding compound used to form an encapsulant 34 for encapsulating the chip 31 to be smaller than that between the first surface 330 of the heat sink 33 and the molding compound. This is to make the remained molding compound (not shown) on the gold layer 333 be easily removed after completing a molding process for forming the encapsulant 34. Moreover, as the gold layer 333 is properly spaced from a top wall of a mold cavity of a mold used in the molding process, the chip 31 and the solder bumps 32 can be assured in quality without being damaged by the pressure from the mold via the heat sink 33. In addition, the heat sink 33 is still exposed to the outside of the encapsulant 34, making the heat-dissipating efficiency increased.

Third Preferred Embodiment

Figure 4:
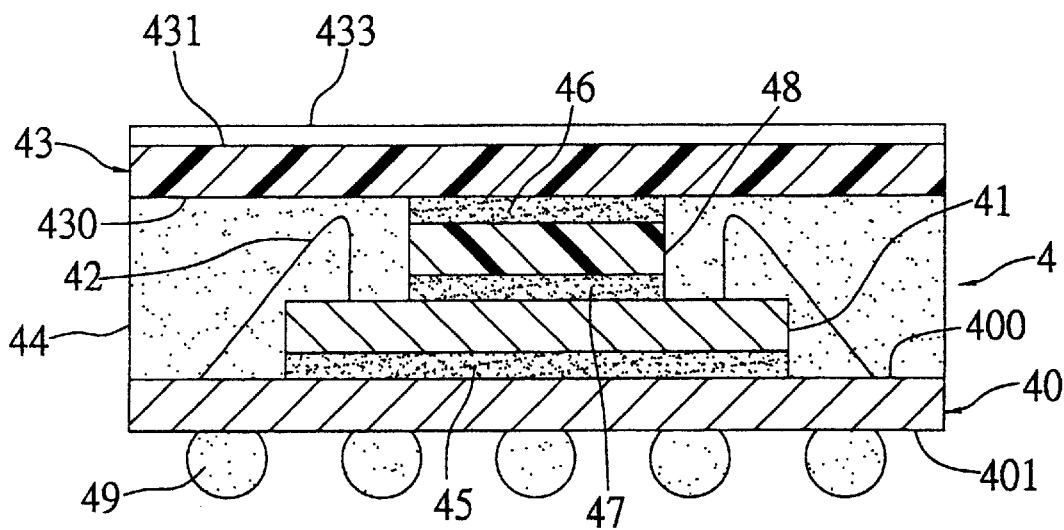
FIG. 4 is a sectional view of a semiconductor package fabricated by a third preferred embodiment of the invention.

FIG. 4 illustrates a semiconductor package 4 fabricated by a third embodiment of the invention. The semiconductor package 4 is fabricated by a method similar to that used for the semiconductor package 2 in the first embodiment, with differences in the die bonding and wire bonding processes due to a conventional BGA substrate 40 and a buffer pad 48 being adopted in the semiconductor package 4. The BGA substrate 40 has an upper surface 400 and a lower surface 401 respectively formed with a plurality of conductive traces (not shown), while the conductive traces on the surfaces 400 and 401 are electrically connected to each other. A chip 41 is attached to the upper surface 400 of the substrate 40 by an adhesive 45 such as silver paste, and then electrically connected to the substrate 40 by a plurality of gold wires 42. Subsequently, prior to provision of a heat sink 43, the buffer pad 48 is attached by an adhesive 47 to an approximately central position of a surface of the chip 41 having the gold wires 42 bonded thereto. The buffer pad 48 has a similar thermal expansion coefficient to the chip 41 and is dimensioned for not interfering the gold wires 42. Further, the buffer pad 48 is constructed to be higher than the wireloop of the gold wires 42, so as to prevent a first surface 430 of the heat sink 43 from coming into contact with the gold wires 42 when attaching the heat sink 43 to the buffer pad 48 by an adhesive 46. Moreover, the buffer pad 48 helps release a thermal stress generated from the heat sink 43 to the chip 41 at a high temperature due to difference in thermal expansion coefficient. This makes the chip 41 not be damaged by the thermal stress, and also allows heat generated by the chip 41 to be transmitted to the heat sink 43 through the buffer pad 48, and to then dissipate the heat into the atmosphere via a surface of the heat sink 43 exposed to the outside of an encapsulant 44, which encapsulates the chip 41 and the buffer pad 48. Furthermore, a second surface 431 of the heat sink 43 is also coated with a gold layer 433. In addition, the lower surface 401 of the substrate 40 is implanted with a plurality of solder balls 49 thereon by a conventional implantation process, so as to electrically connect the chip 41 to an external device.

Fourth Preferred Embodiment

Figure 5:
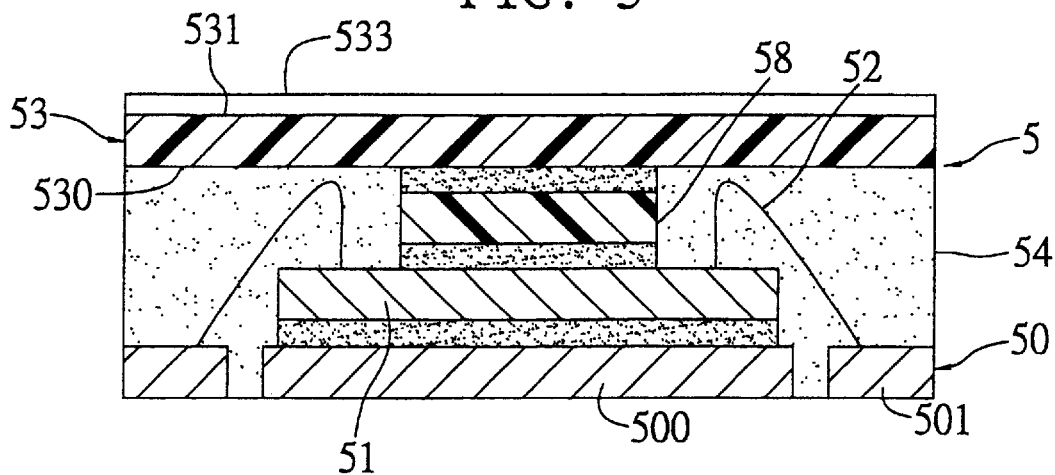
FIG. 5 is a sectional view of a semiconductor package fabricated by a fourth preferred embodiment of the invention.

FIG. 5 illustrates a semiconductor package 5 fabricated by a fourth embodiment of the invention. The semiconductor package 5 is fabricated by a method similar to that used for the semiconductor package 4 in the third embodiment, with differences in the die bonding and wire bonding processes due to that the semiconductor package 5 employs a QFN lead frame 50 as a chip carrier for a chip 51. The QFN lead frame 50 includes a die pad 500 and a plurality of leads 501. The die pad 500 is attached to the chip 51, which is then electrically connected to the leads 501 via gold wires 52. Further, on the chip 51 there is disposed a buffer pad 58, which is used to attach a heat sink 53 thereto, allowing the buffer pad 58 to be interposed between the chip 51 and the heat sink 53. The heat sink 53 has a first surface 530 made to be free of contact with the gold wires 52, while a second surface 531 of the heat sink 53 is also coated with a gold layer 533. Moreover, an encapsulant 54 is formed between the first surface 530 of the heat sink 53 and the QFN lead frame 50 for encapsulating the chip 51 and the buffer pad 58 in a manner that bottom surfaces of the die pad 500 and the leads 501 are exposed to the outside of the encapsulant 54.

Fifth Preferred Embodiment

Figure 6:
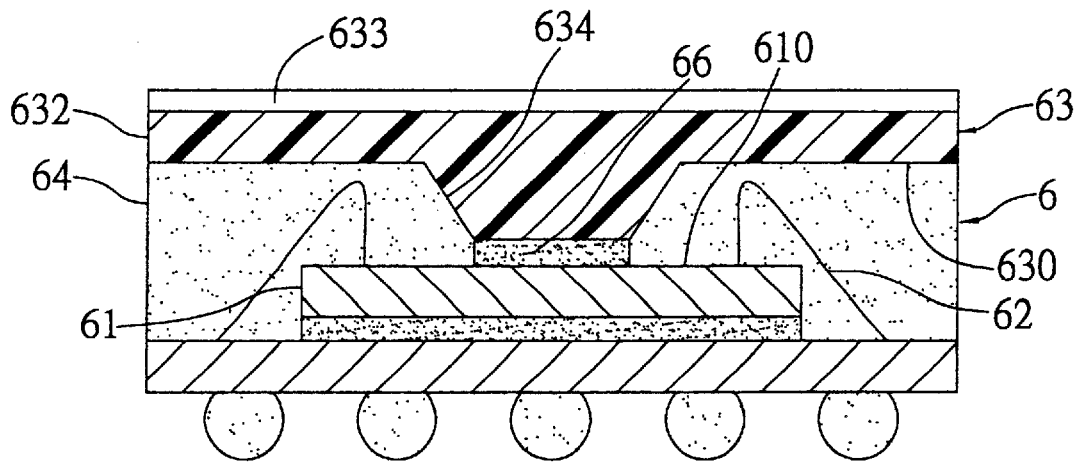
FIG. 6 is a sectional view of a semiconductor package fabricated by a fifth preferred embodiment of the invention.

FIG. 6 illustrates a semiconductor package 6 fabricated by a fifth embodiment of the invention. The semiconductor package 6 is fabricated by a method similar to that used for the semiconductor package 4 in the third embodiment, with the difference in that a heat sink 63 having a connecting portion 634 is used in the semiconductor package 6. The heat sink 63 has a first surface 630 formed with the connecting portion 634 downwardly protruding toward a chip 61 to the extent that the connecting portion 634 is directly attached to an active surface 610 of the chip 61 by an adhesive 66. This allows heat generated by the chip 61 to be transmitted directly to the heat sink 63, and then to be dissipated through a coated gold layer 633 and side surfaces 632 of the heat sink 63 to the atmosphere for improving the heat-dissipating efficiency, while the gold layer 633 and the side surfaces 632 of the heat sink 63 are exposed to the outside of an encapsulant 64 encapsulating the chip 61. Moreover, the connecting portion 634 is dimensioned for the first surface 630 of the heat sink 63 to be properly spaced from the wireloop of the gold wires 62, so as to keep the heat sink 63 from coming into contact with the gold wires 62.

Sixth Preferred Embodiment

Figure 7:
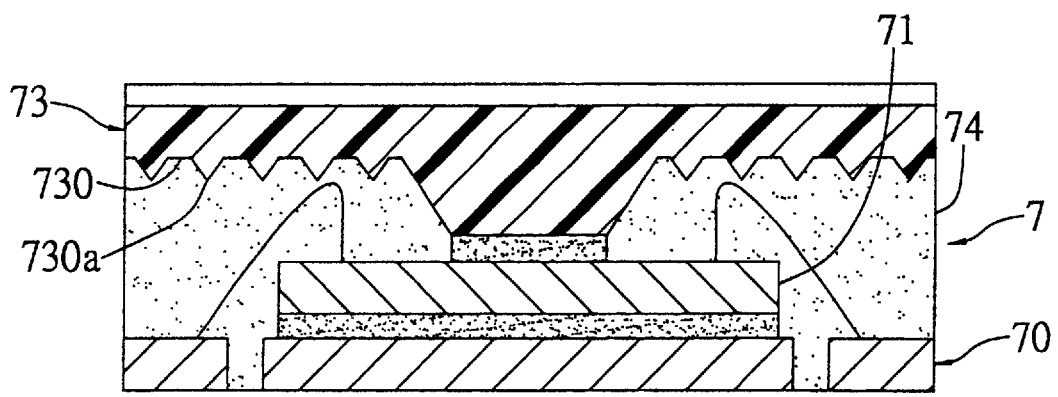
FIG. 7 is a sectional view of a semiconductor package fabricated by a sixth preferred embodiment of the invention.
Figure 8:
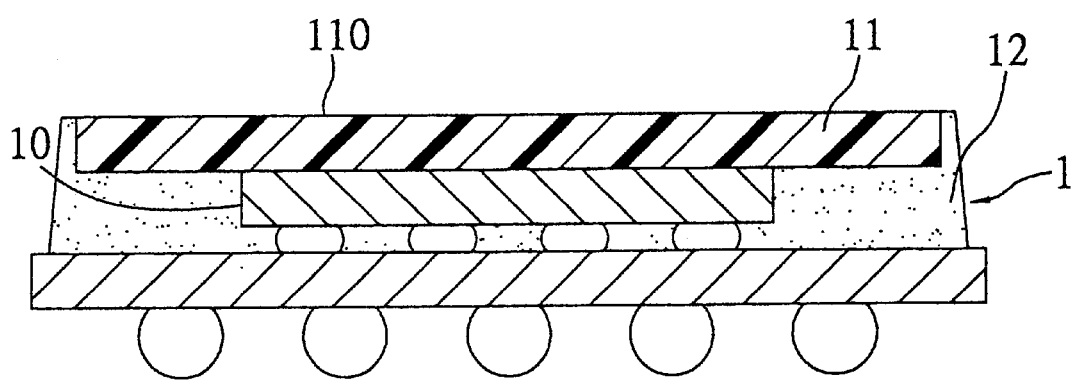
FIG. 8 (PRIOR ART) is a sectional view of a conventional semiconductor package with a heat sink.

FIG. 7 illustrates a semiconductor package 7 fabricated by a sixth embodiment of the invention. The semiconductor package 7 is fabricated by a method similar to that used for the semiconductor package 5 in the fourth embodiment, with the difference in that a heat sink 73 having a plurality of protrusions 730a is used in the semiconductor package 7. The heat sink 73 has a first surface 730 formed with the protrusions 730a, which are used to increase the bonding area between the first surface 730 of the heat sink 73 and an encapsulant 74 for enhancing the bonding strength between the heat sink 73 and the encapsulant 74, while the encapsulant 74 is used to encapsulate a chip 71 mounted on a QFN lead frame 70.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabricating method for a semiconductor package, comprising the steps of:

providing a matrix type chip carrier module plate consisting of a plurality of array-arranged chip carriers, wherein the chip carrier each have an upper surface and lower surface;

mounting at least one chip at a predetermined position on the upper surface of each of the chip carriers, and electrically connecting the chip to the chip carrier;

providing a heat sink module plate consisting of a plurality of heat sinks, the heat sink module plate having an upper surface and lower surface, and attaching the lower surface of the heat sink module plate to the chips such that the chips are interposed between the chip carrier module plate and the heat sink module plate, and the heat sinks correspond in position to the chip carriers of the chip carrier module plate, wherein an interface layer is formed on the upper surface of the heat sink module plate, so as to allow adhesion between the interface layer and a molding compound to be smaller than that between the heat sink module plate and the molding compound;

forming an encapsulant by the molding compound for encapsulating the heat sink module plate, the chips and the chip carrier module plate;

performing a singulation process by singulating through the heat sink module plate, the encapsulant, and the chip carrier module plate, for forming individual semifabricated semiconductor packages with correspondingly singulated heat sinks and chip carriers, wherein side surfaces of the singulated heat sinks are exposed; and removing the molding compound remaining on the interface layer by virtue of the relatively smaller adhesion between the interface layer and the molding compound so as to complete the fabrication of the semiconductor package.

2. The fabricating method of claim 1, wherein the heat sink module plate is sufficiently dimensioned for covering the chip carriers of the chip carrier module plate.

3. The fabricating method of claim 1, wherein interface layer formed on the heat sink module plate is made of a material selected from a group consisting of gold, chromium, nickel, alloy thereof and PTFE (polytetrafluoroethyene).

4. The fabricating method of claim 1, wherein the chip carrier is a substrate.

5. The fabricating method of claim 4, wherein the chip is electrically connected to the substrate by a plurality of bonding wires.

6. The fabricating method of claim 4, wherein the chip is electrically connected to the substrate by a plurality of solder bumps.

7. The fabricating method of claim 1, wherein the chip carrier is a QFN (quad flat nonlead) lead frame.

8. The fabricating method of claim 7, wherein the chip is electrically connected to the QFN lead frame by a plurality of bonding wires.

9. The fabricating method of claim 1, wherein the lower surface of the heat sink module plate is roughened, corrugated or made uneven.

10. The fabricating method of claim 1, wherein on the lower surface of the heat sink module plate corresponding in position to the chips there are formed a plurality of connecting portions respectively extending toward the chips for connecting the heat sink module plate to the chips, while portions of the lower surface of the heat sink module plate other than the connecting portions are spaced apart from the chips.

11. The fabricating method of claim 1, wherein the molding compound remaining on the interface layer is removed from the interface layer by performing a heating process.

12. The fabricating method of claim 1, further comprising a step of implanting a plurality of solder balls on the lower surface of each of the chip carriers for electrically connecting the chips to external devices, subsequent to the formation of the encapsulant.

13. A fabricating method for a semiconductor package, comprising the steps of:

providing a matrix type chip carrier module plate consisting of a plurality array-arranged chip carriers, wherein the chip carriers each have an upper surface and a lower surface;

mounting at least one chip at a predetermined position of the upper surface of each of the chip carriers, and electrically connecting the chip to the chip carrier;

attaching at least one buffer pad to each of the chips, wherein the buffer pad is made of a material having a thermal expansion coefficient corresponding to the chip;

providing a heat sink module plate consisting of a plurality of heat sinks, the heat sink module plate having an upper surface and lower surface, and attaching the lower surface of the heat sink module plate to the buffer pads such that the buffer pads are interposed between the heat sink module plate and the chips so as to space the lower surface of the heat sink module plate from the chips, and the heat sinks correspond in position to the chip carriers of the chip carrier module plate, wherein an interface layer is formed on the upper surface of the sink module plate, so as to allow adhesion between the interface layer and a molding compound to be smaller than that between the heat sink module plate and the molding compound;

forming an encapsulant by the molding compound for encapsulating the heat sink module plate, the chips and the chip carrier module plate;

performing a singulation process by singulating through the heat sink module plate, the encapsulant, and the chip carrier module plate, for forming individual semifabricated semiconductor package with correspondingly singulated heat sinks and chip carriers, wherein side surface of the singulated heat sinks are exposed; and removing the molding compound remaining on the interface layer by virtue of the relatively smaller adhesion between the interface layer and the molding compound so as to complete the fabrication of the semiconductor package.

14. The fabricating method of claim 13, wherein the heat sink module plate is sufficiently dimensioned for covering the chip carriers of the chip carrier module plate.

15. The fabricating method of claim 13, wherein the interface layer formed on the upper surface of the heat sink module plate is made of a material selected from a group consisting of gold, chromium, nickel, alloy thereof and PTFE (polytetrafluoroethyene).

16. The fabricating method of claim 13, wherein the chip carrier is a substrate.

17. The fabricating method of claim 16, wherein the chip is electrically connected to the substrate by a plurality of bonding wires.

18. The fabricating method of claim 13, wherein the chip carrier is a QFN (quad flat nonlead) lead frame.

19. The fabricating method of claim 18, wherein the chip is electrically connected to the QFN lead frame by a plurality of bonding wires.

20. The fabricating method of claim 13, wherein the lower surface of the heat sink module plate is roughened, corrugated or made uneven.

21. The fabricating method of claim 13, wherein the molding compound remaining on the interface layer is removed from the interface layer by performing a heating process.

22. The fabricating method of claim 13, further comprising a step of implanting a plurality of solder balls on the lower surface of each of the chip carriers for electrically connecting the chips to external device, subsequent to the formation of the encapsulant.

* * * * *